United States Patent
Chou et al.

(10) Patent No.: US 10,096,746 B2
(45) Date of Patent: Oct. 9, 2018

(54) SEMICONDUCTOR ELEMENT AND FABRICATION METHOD THEREOF

(71) Applicant: XIAMEN SANAN OPTOELECTRONICS TECHNOLOGY CO., LTD., Xiamen (CN)

(72) Inventors: Sheng-wei Chou, Xiamen (CN); Chang-cheng Chuo, Xiamen (CN); Chan-chan Ling, Xiamen (CN); Chia-hung Chang, Xiamen (CN)

(73) Assignee: XIAMEN SANAN OPTOELECTRONICS TECHNOLOGY CO., LTD., Xiamen (CN)

( * ) Notice: Subject to any disclaimer, the term of this patent is extended or adjusted under 35 U.S.C. 154(b) by 0 days.

(21) Appl. No.: 15/607,484

(22) Filed: May 27, 2017

(65) Prior Publication Data

US 2017/0263822 A1    Sep. 14, 2017

Related U.S. Application Data

(63) Continuation of application No. PCT/CN2016/097754, filed on Sep. 1, 2016.

(30) Foreign Application Priority Data

Sep. 8, 2015 (CN) .......................... 2015 1 0564961

(51) Int. Cl.
| | | |
|---|---|---|
| H01L 33/00 | (2010.01) | |
| H01L 33/48 | (2010.01) | |
| H01L 27/15 | (2006.01) | |
| H01L 33/46 | (2010.01) | |
| H01L 33/04 | (2010.01) | |
| H01L 33/10 | (2010.01) | |

(52) U.S. Cl.
CPC .............. *H01L 33/48* (2013.01); *H01L 27/15* (2013.01); *H01L 33/04* (2013.01); *H01L 33/10* (2013.01); *H01L 33/46* (2013.01)

(58) Field of Classification Search
CPC ......... H01L 33/48; H01L 27/15; H01L 33/46; H01L 33/04; H01L 33/10
USPC .......................................................... 257/88
See application file for complete search history.

(56) References Cited

U.S. PATENT DOCUMENTS

| | | | |
|---|---|---|---|
| 2005/0201439 A1* | 9/2005 | Horie ..................... | B82Y 20/00 372/43.01 |
| 2014/0113437 A1 | 4/2014 | Kim et al. | |

(Continued)

FOREIGN PATENT DOCUMENTS

CN          103262215 A          8/2013

*Primary Examiner* — Vu A Vu
(74) *Attorney, Agent, or Firm* — Syncoda LLC; Feng Ma; Junjie Feng

(57) ABSTRACT

A semiconductor element includes a super-lattice buffer layer including $Al_xN_{1-x}$ layers and $Al_yO_{1-y}$ layers ($0<x<1$, $0<y<1$). The super-lattice buffer layer can mitigate corrosion to the side wall by chemical solution during chip fabrication, and improve chip yield. Fabrication the super-lattice buffer layer to achieve the effects can be realized, for example, using chemical vapor deposition (CVD).

15 Claims, 4 Drawing Sheets

(56) References Cited

U.S. PATENT DOCUMENTS

2014/0346557 A1* 11/2014 Yoshida ................ H01S 5/0282
   257/103
2015/0091043 A1* 4/2015 Shur ..................... H01L 33/382
   257/99

* cited by examiner

SEMICONDUCTOR ELEMENT AND FABRICATION METHOD THEREOF

CROSS-REFERENCE TO RELATED APPLICATIONS

The present application is a continuation of, and claims priority to, PCT/CN2016/097754 filed on Sep. 1, 2016, which claims priority to Chinese Patent Application No. 201510564961.X filed on Sep. 8, 2015. The disclosures of these applications are hereby incorporated by reference in their entirety.

BACKGROUND

Semiconductor cutting technology is evolving from diamond tool cutting to ordinary laser cutting. In laser cutting, the wavelength is generally 355 nm or 266 nm, sufficient to scribe sapphire substrates and various film layers, such as GaN layers, Bragg reflective layers and metal layers. In cutting, a surface cutting channel can be formed by scribing the epitaxial wafer surface with laser. Or, an invisible cutting channel can be formed by focusing a laser inside the substrate to separate a single chip.

In the first case, impurities from laser burning would adhere to the side wall of the cutting channel, which blocks light emission and affects external quantum efficiency (EQE) of the semiconductor element. Therefore, to avoid effects on luminance, after a laser cutting channel is formed, the side wall of the cutting channel is cleaned with immersion and corrosion of chemical solution to remove the laser burning impurities adhered thereto.

Physical vapor deposition (PVD) is an easy-to-operate process that consumes little raw material and causes little environmental pollution. Moreover, the film formed via PVD is dense and even, and is tightly bonded to the base. With these advantages, PVD is increasingly applied in fabrication of semiconductor elements, in particular, to fabrication of bottom layers of epitaxial wafer. For example, by depositing an AlN layer as the buffer layer, defects from lattice mismatch and thermal mismatch between the substrate and the epitaxial layer can be minimized, and the stress caused therefrom can be eased, thus improving quality of the semiconductor element.

However, the multi-lattice and anisotropic AN layer formed via PVD is vulnerable to corrosion by chemical solution. Therefore, if an epitaxial wafer comprises a buffer layer formed via PVD, when the epitaxial wafer surface is cut by a laser and then immersed in chemical solution, the contact surface between the buffer layer and the substrate is prone to over-corrosion, leading to abnormal electricity of chip and low production yield.

SUMMARY

To solve the above problems, various embodiments of the present disclosure provide a semiconductor element comprising a super-lattice buffer layer composed of at least $Al_xN_{1-x}$ layers and $Al_yO_{1-y}$ layers ($0<x<1$, $0<y<1$), wherein, the super-lattice buffer layer can mitigate corrosion to the side wall by chemical solution during chip fabrication and improve chip yield. The present invention also provides a method for fabricating the super-lattice buffer layer to achieve the effects of some embodiments disclosed herein.

Technical approaches of various embodiments of the present disclosure can include: a semiconductor element, comprising: a substrate, a buffer layer, an N-type semiconductor layer, a light-emitting layer and a P-type semiconductor layer, wherein, the buffer layer is a super-lattice structure layer with cyclically (periodically) laminated $Al_xN_{1-x}$ layers and $Al_yO_{1-y}$ layers ($0<x<1$, $0<y<1$); the super-lattice buffer layer can mitigate corrosion to the side wall by chemical solution during chip fabrication and improve chip yield.

In some embodiments, in the first cyclically-laminated layer of the buffer layer, the $Al_xN_{1-x}$ layer is between the $Al_yO_{1-y}$ layer and the substrate.

In some embodiments, thickness of the $Al_xN_{1-x}$ layer is ≥ that of the $Al_yO_{1-y}$ layer.

In some embodiments, the $Al_xN_{1-x}$ layer is 5-500 Å.

In some embodiments, the $Al_yO_{1-y}$ layer is 5-500 Å.

In some embodiments, a non-doping semiconductor layer is provided between the buffer layer and the N-type semiconductor layer.

In some embodiments, number of cycles (periods) in the super-lattice structure layer is ≥2.

Compared with conventional single AlN layer structure, the super-lattice buffer layer disclosed in the present invention is equivalent to divide the single AlN buffer layer into a multi-layer film structure and to insert an $Al_yO_{1-y}$ layer in the multi-layer film. According to test results, the contact surface of the $Al_xN_{1-x}$ layer and the $Al_yO_{1-y}$ layer is better resistant to chemical solution corrosion than the $Al_xN_{1-x}$ layer body. On this basis, a contact surface of the $Al_xN_{1-x}$ layer and the $Al_yO_{1-y}$ layer is added in this super-lattice structure to improve resistance to chemical solution corrosion of the buffer layer; moreover, as the $Al_yO_{1-y}$ layer changes lattice stress of the buffer layer, the final super-lattice buffer layer has higher crystal quality over original AlN buffer layer; therefore, during side-wall corrosion process of subsequent chip fabrication, i.e., when impurities adhered to the side wall of the chip are removed through chemical solution corrosion, corrosion to the buffer layer is mitigated and the effect on chip electricity is reduced. Meanwhile, as the multi-layer film changes the light refraction angle, the super-lattice structure layer can increase light extraction efficiency and improve EQE of the semiconductor element.

Some embodiments disclosed herein provide a method for fabricating the semiconductor bottom layer structure, comprising: S1: providing a substrate; S2: deposing a super-lattice buffer layer composed of $Al_xN_{1-x}$ layers and $Al_yO_{1-y}$ layers ($0<x<1$, $0<y<1$) on the substrate surface via PVD, in which, the buffer layer can mitigate chemical solution corrosion in subsequent chip fabrication and improve chip yield; S3: depositing an epitaxial layer composed of an N-type semiconductor layer, a light-emitting layer and a P-type semiconductor layer on the buffer layer surface via chemical vapor deposition method (CVD), in which, the buffer layer fabricated under low temperature is annealed and re-crystallized in subsequent fabrication of the epitaxial layer under high-temperature to release stress during subsequent depositing process.

As oxygen cannot be doped during depositing in conventional MOCVD, in this method, a super-lattice buffer layer is deposited via PVD and an $Al_yO_{1-y}$ layer is introduced; with anti-corrosion feature of the $Al_yO_{1-y}$ layer and its lattice difference from the $Al_xN_{1-x}$ layer, the buffer layer characteristics of the semiconductor element are improved, thus releasing stress from subsequent depositing of an epitaxial layer and facilitating subsequent chip end fabrication.

In some embodiments, in S2, an $Al_xN_{1-x}$ layer is deposited on the substrate surface via PVD, and an $Al_yO_{1-y}$ layer is deposited on the $Al_xN_{1-x}$ layer surface, thus forming a super-lattice buffer layer through successive and cyclic lamination.

In some embodiments, in S3 of both methods, at first, a non-doping semiconductor layer is deposited on the buffer layer surface and an N-type semiconductor layer is then deposited.

In some embodiments, thickness of the $Al_xN_{1-x}$ layer is ≥ that of the $Al_yO_{1-y}$ layer.

In some embodiments, the $Al_xN_{1-x}$ layer is 5-500 Å.

In some embodiments, the $Al_yO_{1-y}$ layer is 5-500 Å.

In some embodiments, number of cycles in the super-lattice structure layer is ≥2.

In another aspect, a light-emitting system is provided including a plurality of the semiconductor elements described above. The light-emitting system can be used for lighting, signage, displays, etc.

Various embodiments of the present disclosure can have one or more of the following advantages.

1. In the semiconductor element according to some embodiments, the buffer layer is a super-lattice structure comprising $Al_xN_{1-x}$ layers and $Al_yO_{1-y}$ layers (0<x<1, 0<y<1). The contact surface of the $Al_xN_{1-x}$ layer and the $Al_yO_{1-y}$ layer is better resistant to chemical solution corrosion. Therefore, compared with single $Al_xN_{1-x}$ layer, alternative arrangement of $Al_xN_{1-x}$ layers and $Al_yO_{1-y}$ layers enlarges the contact surface, and improves corrosion resistance of the entire buffer layer. Meanwhile, with corrosion resistance of the $Al_yO_{1-y}$ layer material, the buffer layer is more resistant to corrosion to avoid over-corrosion during side-wall corrosion of chip fabrication.

2. Compared MOCVD, oxygen can be doped in PVD depositing of film layers. Therefore, in this method, a super-lattice buffer layer comprising $Al_yO_{1-y}$ layers is deposited via PVD. With anti-corrosion of the $Al_yO_{1-y}$ layer and its lattice difference from the $Al_xN_{1-x}$ layer, the buffer layer characteristics are improved and stress from subsequent epitaxial depositing is released.

3. With the light refraction angle changed by the super-lattice and multi-film structure, both light extraction efficiency and EQE of the semiconductor element are improved.

BRIEF DESCRIPTION OF THE DRAWINGS

The accompanying drawings, which are included to provide a further understanding of the invention and constitute a part of this specification, together with the embodiments, are therefore to be considered in all respects as illustrative and not restrictive. In addition, the drawings are merely illustrative, which are not drawn to scale.

Figure 1:
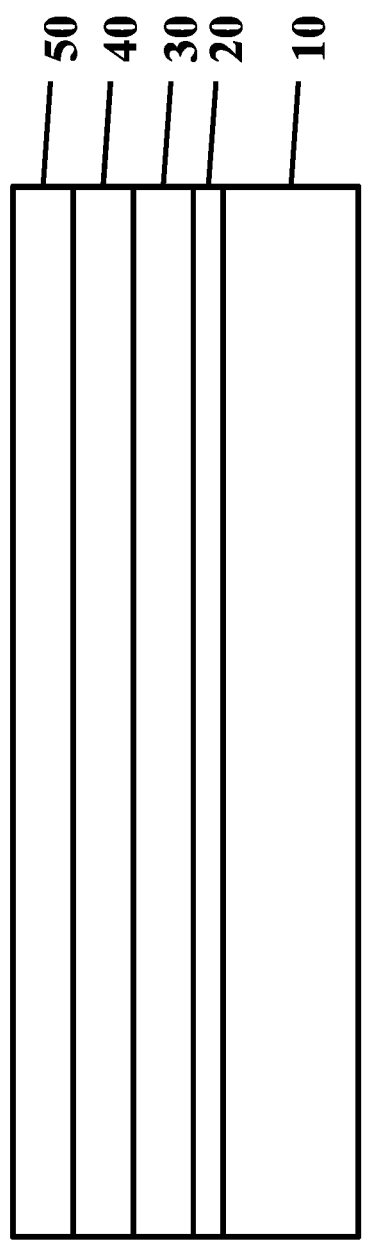
FIG. 1 is a structural diagram of the semiconductor element of Embodiment 1.

In the drawings: 10. substrate; 20. buffer layer; 21. $Al_xN_{1-x}$ layer; 22. $Al_yO_{1-y}$ layer; 30. N-type semiconductor layer; 40. light-emitting layer; 50. P-type semiconductor layer; 60. non-doping semiconductor layer; a. $Al_xN_{1-x}$ layer body; b. contact surface of $Al_xN_{1-x}$ layer 21 and $Al_yO_{1-y}$ layer 22.

DETAILED DESCRIPTION

Various embodiments of the present disclosure will be described in detail with reference to the accompanying drawings and embodiments.

Embodiment 1

Figure 2:
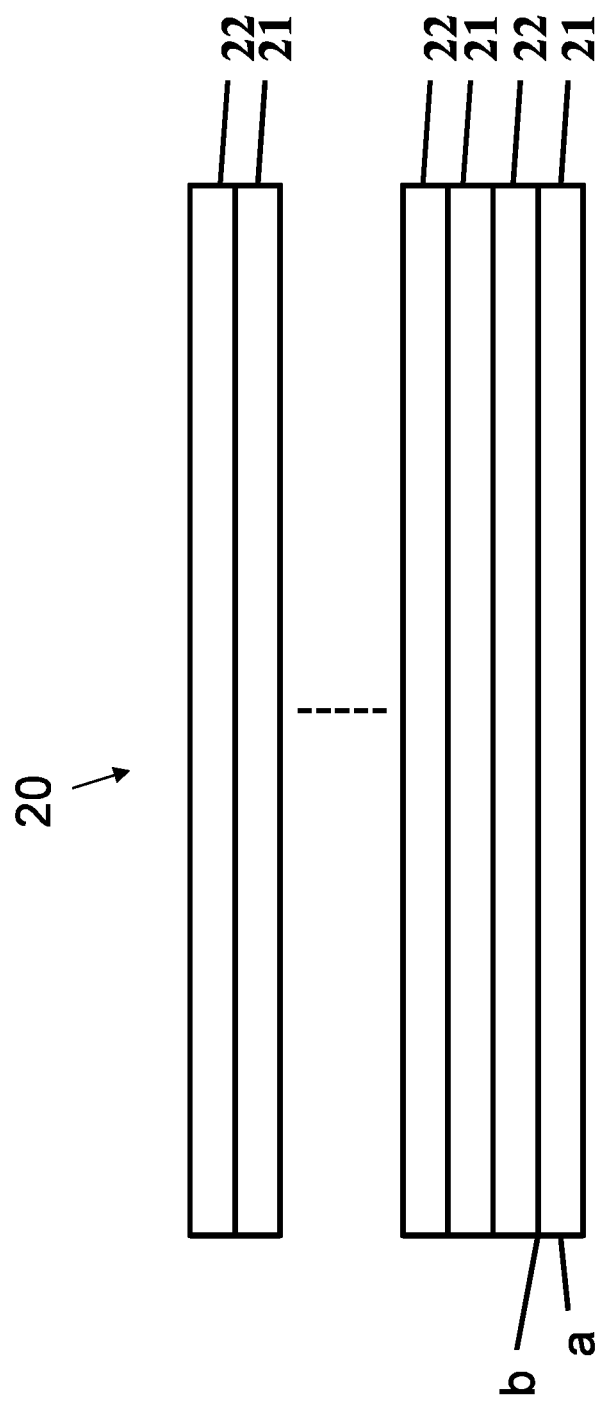
FIG. 2 is a structural diagram of the buffer layer of Embodiment 1.

Referring to FIGS. 1 and 2, a semiconductor element according to the present invention is provided, comprising a substrate 10, a buffer layer 20, an N-type semiconductor layer 30, a light-emitting layer 40 and a P-type semiconductor layer 50, wherein, the buffer layer 20 is a super-lattice structure layer composed of at least of 5-500 Å $Al_xN_{1-x}$ layers 21 and 5-500 Å $Al_yO_{1-y}$ layers 22 (0<x<1, 0<y<1) with number of cycles ≥2, and $Al_xN_{1-x}$ layer 21 thickness ≥$Al_yO_{1-y}$ layer 22 thickness. As test results shown, when thickness ratio of the $Al_xN_{1-x}$ layer 21 and the $Al_yO_{1-y}$ layer 22 is higher, the better lattice quality is the buffer layer 20. In this structure, by forming a buffer layer 20 through the super-lattice structure composed of $Al_xN_{1-x}$ layers 21 and $Al_yO_{1-y}$ layers 22, corrosion to the side wall by chemical solution during subsequent chip fabrication is mitigated and chip yield is improved.

With further reference to FIGS. 1 and 2, compared with the $Al_xN_{1-x}$ layer 21 body a, the contact surface b of the $Al_xN_{1-x}$ layer 21 and the $Al_yO_{1-y}$ layer 22 is better resistant to chemical solution corrosion. Therefore, compared with single AlN layer in conventional structure, alternative arrangement of $Al_xN_{1-x}$ layers 21 and $Al_yO_{1-y}$ layers 22 enlarges the contact surface b, and improves anti-corrosion of the entire buffer layer 20; meanwhile, with corrosion resistance of the $Al_yO_{1-y}$ layer 22 material, the buffer layer 20 is more resistant to corrosion to avoid over-corrosion during side-wall corrosion of chip fabrication. In addition, due to large lattice difference between the $Al_xN_{1-x}$ layer 21 and the $Al_yO_{1-y}$ layer 22, the contact surface of the $Al_xN_{1-x}$ layer 21 and the $Al_yO_{1-y}$ layer 22 in the super-lattice structure is compressed and deformed, thus increasing the release stress ability of the buffer layer 20, easing lattice stress of the subsequently-deposited epitaxial layer, and reducing wrap from stress. Meanwhile, when the buffer layer 20 is a laminated structure with multi-layer films, as different material layers have various refractive indices, the refraction angle of the buffer layer 20 for light emitted by the light-emitting layer 40 is changed, thus increasing light extraction efficiency and improving EQE of the semiconductor element.

To achieve the above structure and function, some embodiments disclosed herein provide a method for fabricating the semiconductor element:

S1. provide a substrate 10, wherein, the substrate is made of sapphire, SiC (6H—SiC or 4H—SiC), Si, GaAs, GaN or single crystal oxide with lattice constant approximate to that of nitride semiconductor. In this invention, a sapphire substrate is preferred.

S2. put the substrate 10 into a PVD chamber. Deposit a super-lattice buffer layer 20 composed of at least 5-500 Å $Al_xN_{1-x}$ layers 21 and 5-500 Å $Al_yO_{1-y}$ layers 22 (0<x<1, 0<y<1) on the surface of the substrate 10 via PVD with number of cycles ≥2, and $Al_xN_{1-x}$ layer 21 thickness ≥$Al_yO_{1-y}$ layer 22 thickness. The buffer layer 20 can mitigate chemical solution corrosion to the side wall in subsequent chip fabrication, and improve chip yield; as an $Al_yO_{1-y}$ layer 22 with oxygen cannot be deposited in conventional MOCVD method, in this method, an $Al_yO_{1-y}$ layer 22 is introduced with PVD to realize the structure feature of the present invention.

S3. put the wafer deposited with the buffer layer 20 to the MOCVD chamber, and deposit an epitaxial layer composed of an N-type semiconductor layer 30, a light-emitting layer 40 and a P-type semiconductor layer 50 on the surface of the buffer layer 20 via MOCVD, wherein, in subsequent fabrication of the epitaxial layer, the buffer layer 20 grown via low-temperature PVD is annealed and re-crystallized under high temperature; annealing for the buffer layer helps release stress in subsequent depositing process and improve crystal quality of the semiconductor element.

According to some embodiments, a semiconductor element is fabricated with a combination of PVD and MOCVD. At first, deposit a buffer layer 20 with oxygen via PVD buffer layer 20. In this way, chemical solution corrosion to the buffer layer 20 is mitigated without affecting formation of the buffer layer on the AlN layer via PVD, thus improving electricity performance of the element after chemical solution treatment. Then, deposit an epitaxial layer composed of an N-type semiconductor layer 30, a light-emitting layer 40 and a P-type semiconductor layer 50 on the surface of the buffer layer 20 via MOCVD to finally form a semiconductor element.

Embodiment 2

Figure 3:
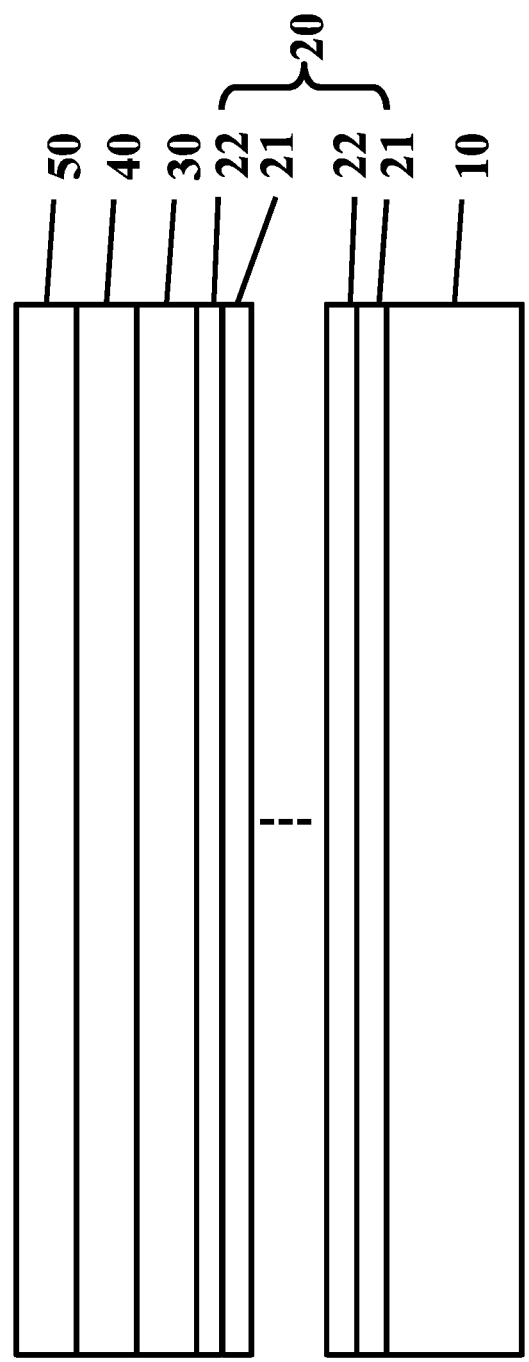
FIG. 3 is a structural diagram of the semiconductor element of Embodiment 2.

Referring to FIG. 3, difference between this embodiment and Embodiment 1 is that, in this embodiment, the buffer layer 20 is a super-lattice structure layer composed of 5-500 Å $Al_xN_{1-x}$ layers 21 and 5-500 Å $Al_yO_{1-y}$ layers 22 (0<x<1, 0<y<1), in which, in the first cyclic laminated layer, the $Al_xN_{1-x}$ layer 21 is between the $Al_yO_{1-y}$ layer 22 and the substrate 10, with number of cycles in the super-lattice structure layer ≥2 and $Al_xN_{1-x}$ layer 21 thickness ≥$Al_yO_{1-y}$ layer 22 thickness.

Difference between the fabrication method of this embodiment and that of Embodiment 1 is that: S2, put the substrate 10 into a PVD chamber. Deposit a super-lattice buffer layer 20 composed of 5-500 Å $Al_xN_{1-x}$ layers 21 and 5-500 Å $Al_yO_{1-y}$ layers 22 (0<x<1, 0<y<1) on the surface of the substrate 10 via PVD. In this step, at first, deposit an $Al_xN_{1-x}$ layer 21 on the surface of the substrate 10, and deposit the $Al_yO_{1-y}$ layer 22 on the surface of the $Al_xN_{1-x}$ layer 21 to form a super-lattice structure through successive and cyclic lamination; number of cycles in the super-lattice structure is at least 2. As the test results shown, on the surface of the substrate 10, either an $Al_xN_{1-x}$ layer 21 or an $Al_yO_{1-y}$ layer 22 can be deposited at first. In this embodiment, it is preferred to deposit an $Al_xN_{1-x}$ layer 21 on the surface of the substrate 10 at first. In this embodiment, the buffer layer 20 can also mitigate chemical solution corrosion to the side wall in subsequent chip fabrication, and improve chip yield.

Embodiment 3

Figure 4:
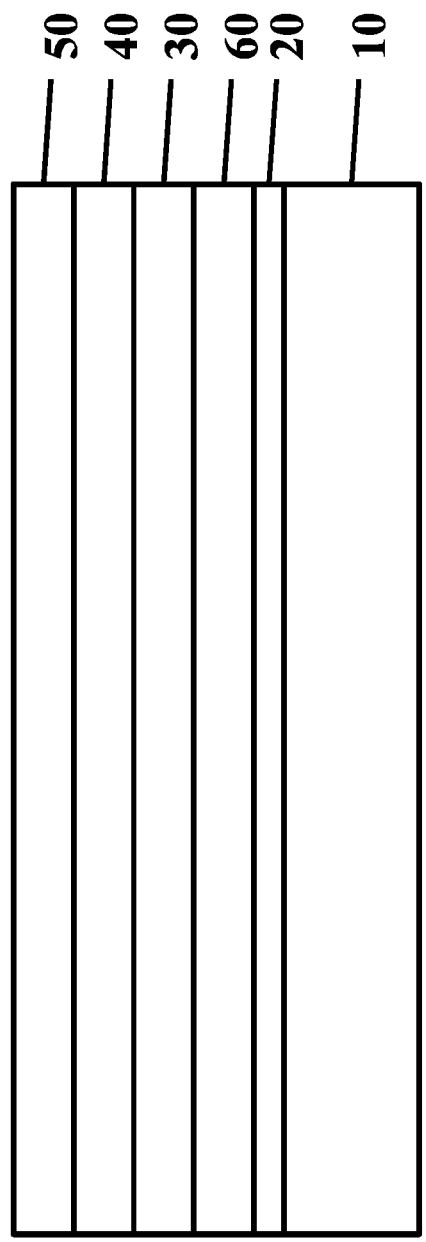
FIG. 4 is a structural diagram of the semiconductor element of Embodiment 3.

Referring to FIG. 4, difference between this embodiment and Embodiment 1 is that, a non-doping semiconductor layer 60 is deposited between the buffer layer 20 and the N-type semiconductor layer 30 to further improve crystal quality of the subsequent epitaxial layer and photoelectric property of the semiconductor element.

All references referred to in the present disclosure are incorporated by reference in their entirety. Although specific embodiments have been described above in detail, the description is merely for purposes of illustration. It should be appreciated, therefore, that many aspects described above are not intended as required or essential elements unless explicitly stated otherwise. Various modifications of, and equivalent acts corresponding to, the disclosed aspects of the exemplary embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

The invention claimed is:

1. A semiconductor element, comprising: a substrate, a buffer layer, an N-type semiconductor layer, a light-emitting layer and a P-type semiconductor layer, wherein: the buffer layer is a super-lattice structure layer with periodically-laminated $Al_xN_{1-x}$ layers and $Al_yO_{1-y}$ layers (0<x<1, 0<y<1); and a first cycle of the super-lattice structure layer, the $Al_yO_{1-y}$ layer is on the $Al_xN_{1-x}$ layer.

2. The semiconductor element according to claim 1, wherein: number of periods in the super-lattice structure layer is ≥2.

3. The semiconductor element according to claim 1, wherein: a thickness of the $Al_xN_{1-x}$ is a thickness of the $Al_yO_{1-y}$ layer.

4. The semiconductor element according to claim 1, wherein: the $Al_xN_{1-x}$ layer and the $Al_yO_{1-y}$ layer each have a thickness of 5-500 Å.

5. The semiconductor element according to claim 1, wherein: a non-doping semiconductor layer is disposed between the buffer layer and the N-type semiconductor layer.

6. A semiconductor element, comprising: a substrate, a buffer layer, an N-type semiconductor layer, a light-emitting layer and a P-type semiconductor layer, wherein: the buffer layer is a super-lattice structure layer with periodically-laminated $Al_xN_{1-x}$ layers and $Al_yO_{1-y}$ layers (0<x<1, 0<y<1), wherein: the super-lattice structure layer is configured to mitigate corrosion to a side wall by chemical solution during chip fabrication and improve chip yield.

7. A light-emitting system comprising a plurality of semiconductor elements, each semiconductor element comprising: a substrate, a buffer layer, an N-type semiconductor layer, a light-emitting layer and a P-type semiconductor layer, wherein: the buffer layer is a super-lattice structure layer with periodically-laminated $Al_xN_{1-x}$ layers and $Al_yO_{1-y}$ layers (0<x<1, 0<y<1); and a thickness of the $Al_xN_{1-x}$ is a thickness of the $Al_yO_{1-y}$ layer.

8. The system according to claim 7, wherein: a first cycle of the super-lattice structure layer, the $Al_yO_{1-y}$ layer is on the $Al_xN_{1-x}$ layer.

9. The system according to claim 7, wherein: the super-lattice structure layer is configured to mitigate corrosion to a side wall by chemical solution during chip fabrication and improve chip yield.

10. The system according to claim 7, wherein: number of periods in the super-lattice structure layer is ≥2.

11. The system according to claim 7, wherein: the $Al_xN_{1-x}$ layer and the $Al_yO_{1-y}$ layer each have a thickness of 5-500 Å.

12. The system according to claim 7, wherein: a non-doping semiconductor layer is disposed between the buffer layer and the N-type semiconductor layer.

13. The system according to claim 7, wherein each element is fabricated with a method comprising:

S1. providing a growth substrate;

S2. deposing a super-lattice buffer layer composed of periodically-laminated $Al_xN_{1-x}$ layers and $Al_yO_{1-y}$ layers ($0<x<1$, $0<y<1$) on the substrate surface via physical vapor deposition (PVD), in which, the buffer layer can mitigate corrosion to the side wall by chemical solution in subsequent chip fabrication and improve chip yield;

S3. depositing an epitaxial layer composed of an N-type semiconductor layer, a light-emitting layer and a P-type semiconductor layer on the buffer layer surface via chemical vapor deposition (CVD).

14. The system according to claim 13, wherein: in S2, an $Al_xN_{1-x}$ layer is deposited on the substrate surface via PVD, and an $Al_yO_{1-y}$ layer is deposited on a surface of the $Al_xN_{1-x}$ layer, thereby forming a super-lattice buffer layer through successive and periodical lamination.

15. The system according to claim 14, wherein: in S3, at first, a non-doping semiconductor layer is deposited on the buffer layer surface and an N-type semiconductor layer is then deposited.

\* \* \* \* \*